United States Patent
Kim et al.

(10) Patent No.: US 9,123,660 B2
(45) Date of Patent: Sep. 1, 2015

(54) CHEMICAL MECHANICAL POLISHING SLURRY COMPOSITIONS AND POLISHING METHOD USING THE SAME

(75) Inventors: Tai Young Kim, Uiwang-si (KR); Byoung Ho Choi, Uiwang-si (KR); Chang Ki Hong, Uiwang-si (KR); Hyung Soo Kim, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/534,647

(22) Filed: Jun. 27, 2012

(65) Prior Publication Data

US 2012/0282775 A1 Nov. 8, 2012

Related U.S. Application Data

(63) Continuation-in-part of application No. PCT/KR2010/009637, filed on Dec. 31, 2010.

(30) Foreign Application Priority Data

Dec. 31, 2009 (KR) .......................... 10-2009-0136124
Dec. 31, 2010 (KR) .......................... 10-2010-0139758

(51) Int. Cl.
*C09G 1/02* (2006.01)
*C09K 3/14* (2006.01)
*H01L 21/3105* (2006.01)

(52) U.S. Cl.
CPC ............ *H01L 21/31053* (2013.01); *C09G 1/02* (2013.01); *C09K 3/1409* (2013.01); *C09K 3/1463* (2013.01)

(58) Field of Classification Search
CPC ....... C09G 1/02; H01L 21/306; C09K 3/1409

USPC ..................... 252/79.1; 438/693; 257/E21.23
See application file for complete search history.

(56) References Cited

U.S. PATENT DOCUMENTS

| | | | |
|---|---|---|---|
| 2006/0258267 A1 | 11/2006 | Ito et al. | |
| 2007/0251270 A1* | 11/2007 | Miyatani et al. | 65/31 |
| 2008/0003924 A1 | 1/2008 | Kurata et al. | |
| 2008/0067077 A1* | 3/2008 | Kodera et al. | 205/645 |

(Continued)

FOREIGN PATENT DOCUMENTS

| | | |
|---|---|---|
| CN | 101064121 A | 10/2007 |
| CN | 101410955 | 4/2009 |

(Continued)

OTHER PUBLICATIONS

Taiwanese Office Action in counterpart Taiwanese Application No. 99147263 issued on Jul. 3, 2013, pp. 1-4.

(Continued)

*Primary Examiner* — Duy Deo
*Assistant Examiner* — Mahmoud Dahimene
(74) *Attorney, Agent, or Firm* — Additon, Higgins & Pendleton, P.A.

(57) ABSTRACT

Disclosed herein is a CMP slurry composition. The CMP slurry composition includes cerium oxide particles, an adsorbent for adsorbing the cerium oxide particles to a polishing pad, an adsorption adjusting agent for adjusting adsorption performance of the adsorbent, and a pH adjusting agent. The CMP slurry composition may improve polishing efficiency of a patterned oxide layer and lifespan of a diamond disc conditioner.

8 Claims, 3 Drawing Sheets

(56) References Cited

U.S. PATENT DOCUMENTS

| | | | |
|---|---|---|---|
| 2008/0176982 A1 | 7/2008 | Haga et al. | |
| 2008/0261400 A1* | 10/2008 | Yoshida et al. | 438/692 |
| 2009/0047786 A1 | 2/2009 | Fukasawa et al. | |
| 2009/0130849 A1* | 5/2009 | Lee | 438/693 |
| 2011/0250756 A1 | 10/2011 | Uchikura et al. | |

FOREIGN PATENT DOCUMENTS

| | | |
|---|---|---|
| JP | 2003-347248 A | 12/2003 |
| JP | 2004-276219 A | 10/2004 |
| JP | 2005-072499 A | 3/2005 |
| JP | 2006-318952 A | 11/2006 |
| KR | 10-2004-0060613 A | 7/2004 |
| TW | 200307032 | 12/2003 |
| WO | 2011/081503 A2 | 7/2011 |

OTHER PUBLICATIONS

English translation of Taiwanese Search Report in counterpart Taiwanese Application No. 99147263 issued on Jul. 3, 2013, pp. 1.

Chinese Office Action in counterpart Chinese Application No. 201080059220.1 issued on Jul. 11, 2013, pp. 1-8.

English translation of Chinese Office Action in counterpart Chinese Application No. 201080059220.1 issued on Jul. 11, 2013, pp. 1-6.

International Search Report in counterpart International Application No. PCT/KR2010/009637 dated Sep. 20, 2011, pp. 1-3.

Lee et al., "The Effects of Slurries with Pattern Size and Step Height in Shallow Trench Isolation Chemical Mechanical Polishing" (Mar. 2-3, 2000) CMP-MIC Conference, pp. 163-168.

Office Action and Search Report in counterpart Chinese Application No. 201080059220.1 issued on Jan. 9, 2014, pp. 1-10.

Office Action in counterpart Korean Application No. 10-2010-0139758 issued on Jun. 26, 2014, pp. 1-3.

* cited by examiner

CHEMICAL MECHANICAL POLISHING SLURRY COMPOSITIONS AND POLISHING METHOD USING THE SAME

CROSS-REFERENCE TO RELATED APPLICATIONS

This application is a continuation-in-part of International Application No. PCT/KR2010/009637, filed Dec. 31, 2010, pending, which designates the U.S., published as WO 2011/081503, and is incorporated herein by reference in its entirety, and claims priority therefrom under 35 USC Section 120. This application also claims priority under 35 USC Section 119 from Korean Patent Application No. 10-2009-0136124, filed Dec. 31, 2009, in the Korean Intellectual Property Office, and Korean Patent Application No. 10-2010-0139758, filed Dec. 31, 2010, in the Korean Intellectual Property Office, the entire disclosure of each of which is also incorporated herein by reference.

FIELD OF THE INVENTION

The present invention relates to a slurry composition for chemical mechanical polishing (CMP) for planarization of a semiconductor wafer in a semiconductor manufacturing process and a polishing method using the same.

BACKGROUND

In recent years, improvements in performance, as well as increased integration of semiconductor devices, have resulted in a further reduction in line width of wire patterns and multilayer structures with more layers. Layer planarization in each process plays an important role in improvement of accuracy in photolithography. Chemical mechanical polishing (CMP) is the most well-known planarization technique in the art and may be classified as oxide layer CMP, metal CMP, and polysilicon CMP, depending on the target material.

Examples of a semiconductor process that employ CMP to polish an oxide layer include an interlayer dielectric (ILD) process and a shallow trench isolation (STI) process. The ILD process is a process for removing excess from a silicon oxide layer formed for interlayer insulation, and the STI process is a process for isolating devices from each other through formation of trenches for insulation between chips.

Although silica ($SiO_2$) slurries have generally been used when initially polishing the oxide layer, cerium oxide ($CeO_2$) slurries are commonly used when polishing the oxide layer to achieve high planarization for reduction in design rule and thickness of devices. Cerium oxide slurries exhibit high polishing selectivity, making them ideal for wafers comprising heterogeneous films. That is, since the cerium oxide slurries have a very high polishing rate with respect to a silicon oxide layer and a very low polishing rate with respect to a silicon nitride ($Si_3N_4$) layer, the cerium oxide slurries enable polishing of a silicon nitride portion of a heterogeneous layer without having any impact upon a polished silicon oxide portion, when used for polishing the silicon oxide layer and the silicon nitride layer with step portions formed thereon. The cerium oxide slurries make it possible to achieve broad planarization and accurate control of polishing thickness when applied to oxide layer CMP.

The cerium oxide slurries have a higher polishing rate than the silica slurries with respect to a flat silicon oxide layer (that is, a flat wafer) having no groove or protrusion. However, when the cerium oxide slurries are applied to polishing of a patterned silicon oxide layer having grooves or protrusions, the initial polishing rate of the patterned oxide layer is very low and then increases as the step portions are gradually removed from the oxide layer. That is, the cerium oxide slurries have a problem of low initial polishing rate when polishing the patterned oxide layer.

Such a problem is referred to as initial loading effect. In practical implementation, polishing is generally performed upon patterned oxide films having grooves or protrusions thereon, thereby causing a problem relating to an initial loading effect. To solve such a problem in polishing the patterned oxide layer, silica slurries which do not cause the problem relating to an initial loading effect are initially used, followed by use of cerium oxide slurries. However, when both the silica slurries and the cerium oxide slurries are used in polishing the patterned oxide layer, there is a problem of deterioration in polishing efficiency due to replacement of the slurries during the polishing process.

In another approach for improving polishing efficiency, chemical additives for enhancing an initial loading effect are added to CMP slurries. In this case, however, there is a problem in that the additives increase abrasion of diamond particles in a diamond disc conditioner which increases the activity of the polishing pad, thereby reducing lifespan of the conditioner.

Additionally, to improve the initial loading effect, Sang-Ick Lee et al. suggest a technique for adjusting the particle size of the cerium oxide slurry particle to 100 nm or less (CMP-MIC, p. 163 (2000)). However, this technique is not suitable for practical application due to a very low absolute polishing rate despite the increase in the ratio of pattern polishing rate to blanket polishing rate.

SUMMARY OF THE INVENTION

The present invention provides a CMP slurry composition including: cerium oxide particles; an adsorbent for adsorbing the cerium oxide particles to a polishing pad; an adsorption adjusting agent for adjusting adsorption performance of the adsorbent; and a pH adjusting agent.

The adsorbent may be a heteroaryl compound having at least one hetero atom selected from oxygen (O), nitrogen (N), sulfur (S), and combinations thereof.

The present invention also provides a polishing method including polishing a semiconductor wafer using the CMP slurry composition.

DETAILED DESCRIPTION OF THE INVENTION

The present invention now will be described more fully hereinafter in the following detailed description of the invention, in which some, but not all embodiments of the invention are described with reference to the accompanying drawings.

Indeed, this invention may be embodied in many different forms and should not be construed as limited to the embodiments set forth herein; rather, these embodiments are provided so that this disclosure will satisfy applicable legal requirements.

The present invention provides a CMP slurry composition that includes: cerium oxide particles; an adsorbent; an adsorption adjusting agent; and a pH adjusting agent.

1. Cerium Oxide Particles

The CMP slurry composition includes cerium oxide ($CeO_2$) particles for polishing an oxide layer. Any well-known method for preparing metal oxide particles may be used to prepare the cerium oxide particles. As non-limiting examples, a solid phase method, a liquid phase method, and a vapor phase method may be used. In exemplary embodiments, the cerium oxide particles may be prepared by heat-treating cerium carbonate at a temperature of about 600 to about 1000° C. for a few minutes to a dozen hours.

The CMP slurry composition may include the cerium oxide particles in an amount of about 0.01 to about 10 percent by weight (wt %), for example about 0.01 to about 3% wt %, based on the total weight of the CMP slurry composition. In some embodiments, the CMP slurry composition may include the cerium oxide particles in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the cerium oxide particles can be in a range from about any of the foregoing amounts to about any other of the foregoing amounts.

The CMP slurry composition may further include other particles. Examples of other particles that can be included in the CMP slurry composition include without limitation silica ($SiO_2$) polishing particles, alumina ($Al_2O_3$) polishing particles, zirconia ($ZrO_2$) polishing particles, titania ($TiO_2$) polishing particles, and the like, and combinations thereof.

2. Adsorbent

The CMP slurry composition includes an adsorbent for adsorbing the cerium oxide particles to a polishing pad. The adsorbent enhances activity of the cerium oxide particles and helps the cerium oxide particles to exhibit suitable adsorbing strength with respect to the polishing pad. As a result, the CMP slurry composition may increase polishing rate with respect to a patterned oxide layer.

Figure 1:
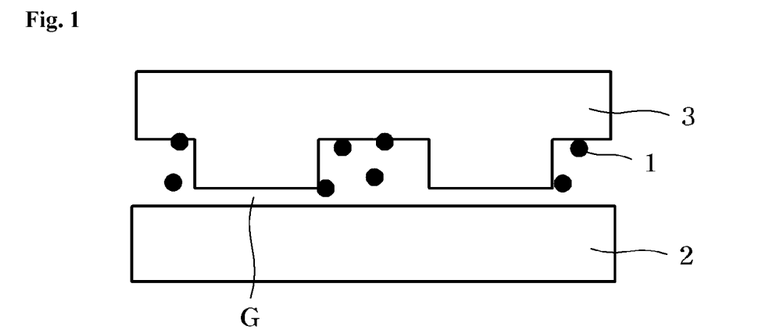
FIG. 1 is a side section view of a polishing pad to which cerium oxide particles are not firmly adhered.

When the cerium oxide particles 1 are not firmly adhered to a polishing pad 2, as shown in FIG. 1, during polishing of the patterned oxide layer, the cerium oxide particles 1 can move and may not be introduced into a gap G between the polishing pad 2 and the patterned oxide layer 3 when a wafer (not shown) including the polishing pad 2 and the patterned oxide layer 3 are rotated for polishing, thereby deteriorating pattern polishing efficiency.

Figure 2:
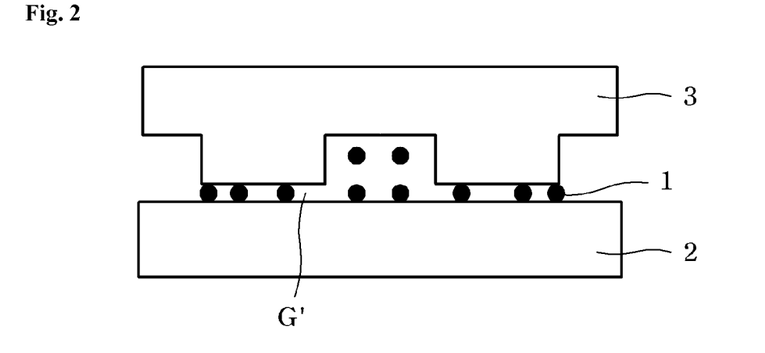
FIG. 2 is a side section view of the polishing pad to which the cerium oxide particles are finely adhered.

In the present invention, however, as shown in FIG. 2, the adsorbent allows the cerium oxide particles 1 to be firmly adhered to the polishing pad 2, so that cerium oxide particles are present in a gap G' between the polishing pad and the patterned oxide layer, thereby enhancing polishing efficiency of the patterned oxide layer 3.

The adsorbent may be a chelating agent that binds to metal oxides, for example, the cerium oxide particles, and exhibits high affinity to a polishing pad, which can be mainly composed of polyurethane or the like. The cerium oxide particles are firmly adsorbed to the polishing pad through the adsorbent, thereby increasing polishing rate. For example, the adsorbent may be a heteroaryl compound having at least one hetero atom selected from oxygen (O), nitrogen (N), sulfur (S), and combinations thereof.

Examples of the heteroaryl compound used as the adsorbent may include, but are not limited to, 3-hydroxy-1,2-dimethyl-4(1H)-pyridone, 2-hydroxy-3,5-dinitropyridine, isonicotinic acid, nicotinic acid, picolinic acid, 3-quinoline carboxylic acid, 4-quinoline carboxylic acid, 2,4-quinolinediol, 2,6-quinolinediol, 2,8-quinolinediol, 4-quinolinol, 5-quinolinol, 8-quinolinol, 4-pyridoxic acid, and the like, and combinations thereof.

A chelate compound or organic acid not containing such a heteroaryl group may increase blanket polishing rate, but provides a very low pattern polishing rate due to very poor adhesion of the cerium oxide particles to the polishing pad. However, since the heteroaryl compound can increase the adhesive force of the cerium oxide particles to the polishing pad, the heteroaryl compound makes it possible to increase polishing rate when polishing a patterned oxide layer.

The CMP slurry composition may include the adsorbent in an amount of about 0.0001 to about 1 wt %, for example about 0.001% to about 0.5 wt %, based on the total weight of the CMP slurry composition. In some embodiments, the CMP slurry composition may include the adsorbent in an amount of about 0.0001, 0.0002, 0.0003, 0.0004, 0.0005, 0.0006, 0.0007, 0.0008, 0.0009, 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1 wt %. Further, according to some embodiments of the present invention, the amount of the adsorbent can be in a range from about any of the foregoing amounts to about any other of the foregoing amounts.

When the CMP slurry composition includes the adsorbent in an amount within this range, the slurry composition may not suffer from a reduction in polishing rate of the patterned oxide layer or polishing rate of the blanket oxide layer.

3. Adsorption Adjusting Agent

The CMP slurry composition includes an adsorption adjusting agent for adjusting the adhesive force of the cerium oxide particles. As the cerium oxide particles are firmly adhered to the polishing pad by the adsorbent, the polishing efficiency of the patterned oxide layer may be increased. However, an excessively high adhesive force can cause scratches on the surface of the wafer during the polishing process and can promote abrasion of diamond particles of a diamond disc conditioner, which activates the polishing pad, which can deteriorate activity of the polishing pad.

Figure 3:
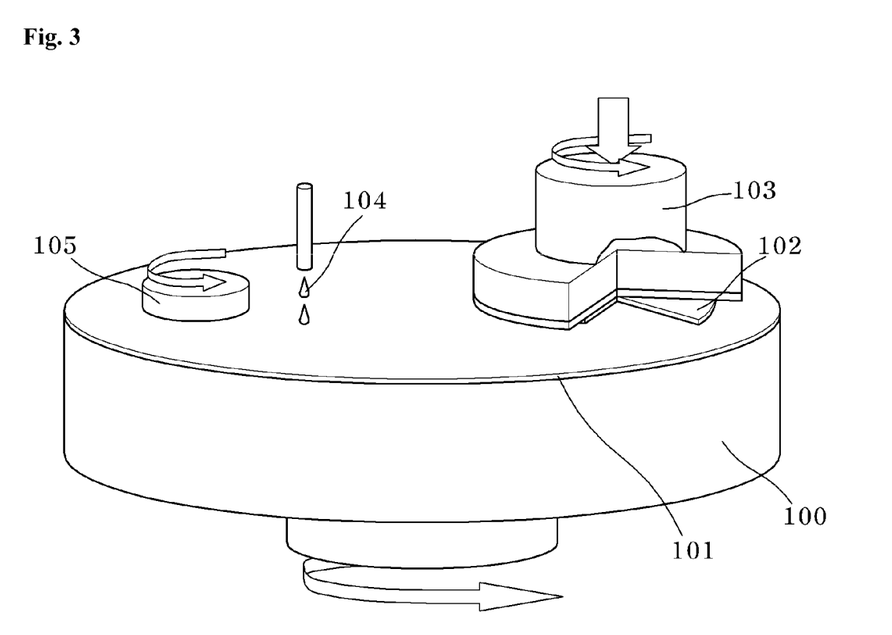
FIG. 3 is a perspective view of a diamond disc conditioner for enhancing activity of a polishing pad during polishing.

As the semiconductor wafer is polished using the polishing pad, the surface of the polishing pad gradually becomes rough and residues accumulate thereon, such as polishing particles and sediments of the polishing pad, thereby deteriorating the activity of the polishing pad. Accordingly, it is necessary to increase the activity of the polishing pad by abrading the surface of the polishing pad before, after or during the polishing process using the diamond disc conditioner. FIG. 3 shows a process of increasing activity of the polishing pad using the diamond disc conditioner during polishing. With a wafer 102 and a polishing pad 101 sequentially placed and rotated on a platen 100, a CMP slurry composition 104 is dropped onto the wafer 102 while pressure is applied to the wafer 102 using a head 103 to abrade the polishing pad 101. Here, the polishing pad 101 is activated while the diamond disc conditioner 105 is rotated on the polishing pad 101.

If the adhesive force of the cerium oxide particles to the polishing pad is excessively high, the abrasion rate of the diamond particles in the conditioner operated to remove the cerium oxide particles can increase, which can reduce lifespan of the conditioner. In this case, if the used conditioner is not properly managed, the activity of the polishing pad can deteriorate, which can deteriorate polishing efficiency.

Accordingly, in order to improve polishing efficiency of the patterned oxide layer, it is desirable that the adhesive force of the cerium oxide particles be suitably controlled to permit the cerium oxide particles to be firmly adhered to the polishing pad while facilitating removal of the cerium oxide particles and minimizing collision between the cerium oxide particles on the polishing pad and the diamond particles. The CMP slurry composition includes an adsorption adjusting agent that adjusts adsorption performance of the adsorbent to control adhesion of the cerium oxide particles to the polishing pad.

The adsorption adjusting agent may include a non-ionic surfactant that exhibits excellent solubility with respect to water. In exemplary embodiments, the non-ionic surfactant may be a compound represented by the following Formula 1, Formula 2, or a combination thereof.

$RO(CH_2CH_2O)n\text{-}R'$            Formula 1

$RO(CH_2CHCH_3O)n\text{-}R'$          Formula 2

In Formulas 1 and 2, R and R' are the same or different and each independently hydrogen or $C_1$-$C_{18}$ alkyl, and n is an integer from 3 to 10.

In one embodiment, R and R' are hydrogen and n is an integer from 3 to 8.

Since the non-ionic surfactant surrounds the cerium oxide particles via an electrostatic attractive force, the non-ionic surfactant may facilitate removal of the cerium oxide particles while minimizing collision between the cerium oxide particles and the diamond particles of the conditioner. Specifically, since the cerium oxide particles can have a positive charge under conditions of about pH 6 or less, the non-ionic surfactant surrounds the cerium oxide particles due to the electrostatic attractive force between the positively charged cerium oxide particles and unshared electron pairs of the non-ionic surfactant.

Figure 4:
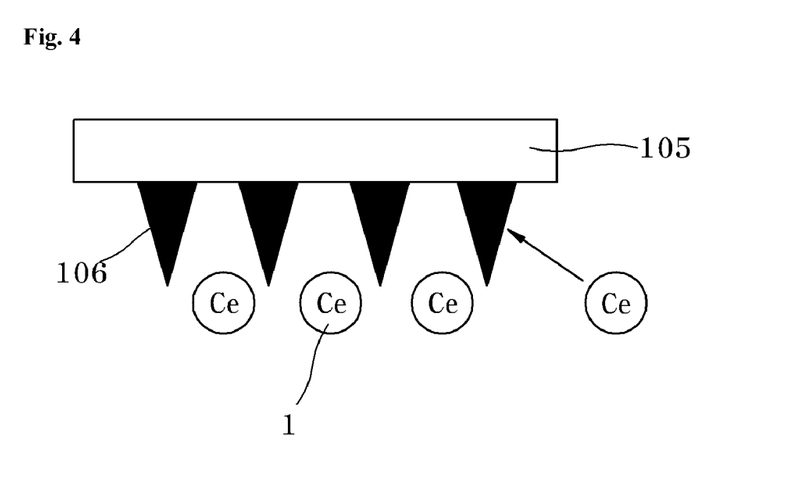
FIG. 4 shows the diamond disc conditioner and a CMP slurry composition, from which an adsorption adjusting agent is omitted.
Figure 5:
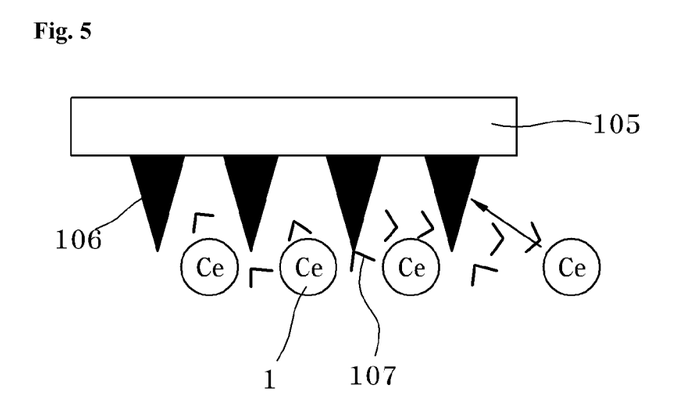
FIG. 5 shows the diamond disc conditioner and a CMP slurry composition, to which an adsorption adjusting agent is added.

Accordingly, when the cerium oxide particles 1 are not surrounded by the non-ionic surfactant as shown in FIG. 4, the cerium oxide particles 1 come into direct contact with the diamond particles 106 of the conditioner 105, whereby the rate at which abrasion of the diamond particles occurs increases and the cerium oxide particles 1 are not easily removed. In contrast, as shown in FIG. 5, the adsorption adjusting agent 107 surrounds the cerium oxide particles 1 and minimizes collision between the diamond particles 106 of the diamond disc conditioner 105 and the cerium oxide particles, which can extend the lifespan of the conditioner 105.

To ensure that the cerium oxide particles are positively charged, the CMP slurry composition may have a pH of about 6 or less. In exemplary embodiments, the CMP slurry composition has a pH of about 2.5 to about 4.5.

The adsorption adjusting agent provided as the non-ionic surfactant may include polyethylene glycol having a weight average molecular weight of about 200 to about 3500 g/mol or polypropylene glycol having a weight average molecular weight of about 200 to about 3500 g/mol.

The CMP slurry composition may include the non-ionic surfactant in an amount of about 0.01 to about 1 wt %, for example about 0.05 to about 1 wt %, based on the total weight of the CMP slurry composition. In some embodiments, the CMP slurry composition may include the non-ionic surfactant in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1 wt %. Further, according to some embodiments of the present invention, the amount of the non-ionic surfactant can be in a range from about any of the foregoing amounts to about any other of the foregoing amounts.

When the CMP slurry composition includes the non-ionic surfactant in an amount within this range, the non-ionic surfactant may minimize collision between the cerium oxide particles and the diamond particles of the diamond disc conditioner while preventing the polishing rate of the patterned oxide layer from deteriorating over time.

4. pH Adjusting Agent

The CMP slurry composition includes a pH adjusting agent. The pH adjusting agent adjusts the pH of the CMP slurry composition. Examples of the pH adjusting agent may include, but are not limited to, organic acids, such as formic acid, acetic acid, lactic acid, propionic acid, pentanoic acid, hexanoic acid, heptanoic acid, octanoic acid, oxalic acid, malic acid, maleic acid, glutamic acid, tartaric acid, malonic acid, fumaric acid, citric acid, glycolic acid, succinic acid, butyric acid, and the like; basic substances, such as trimethanolamine, triethanolamine, trimethylammonium hydroxide, triethylammonium hydroxide, dimethylbenzylamine, ethoxybenzyl amine, potassium hydroxide, and the like; and the like, and combinations thereof.

As described above, the CMP slurry composition may be adjusted to a pH of about 6 or less by the pH adjusting agent such that all of the cerium oxide particles are positively charged and can be protected by the adsorption adjusting agent, particularly, by the non-ionic surfactant. Within this pH range, the CMP slurry composition may not suffer from deterioration in polishing performance and dispersion stability, and can improve adsorption characteristics such that the slurry composition does not cause scratches (and/or minimizes scratching) on the wafer due to contamination of a surface of polishing equipment. In exemplary embodiments, the CMP slurry composition is adjusted to a pH of about 2.5 to about 5.0, for example about 2.5 to about 4.5.

The CMP slurry composition may include the pH adjusting agent in an amount of about 0.0001 to about 1 wt %, for example 0.001 to about 0.5 wt %, based on the total weight of the CMP slurry composition. In some embodiments, the CMP slurry composition may include the pH adjusting agent in an amount of about 0.0001, 0.0002, 0.0003, 0.0004, 0.0005, 0.0006, 0.0007, 0.0008, 0.0009, 0.001; 0.002, 0.003, 0.004, 0.005, 0.006, 0.007, 0.008, 0.009, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1 wt %. Further, according to some embodiments of the present invention, the amount of the pH adjusting agent can be in a range from about any of the foregoing amounts to about any other of the foregoing amounts.

When the CMP slurry composition includes the pH adjusting agent in an amount within this range, the CMP slurry composition may not suffer from deterioration in polishing performance and dispersion stability.

In the CMP slurry composition, adsorption of the cerium oxide particles may be suitably adjusted by the adsorbent and the adsorption adjusting agent. A suitable degree of adsorption may be determined through experimentation, as described below. Adsorption of the cerium oxide particles to the polishing pad can be about 15% or less, for example about 1 to about 15%, and as another example about 5 to about 10%.

If the degree of adsorption of the cerium oxide particles to the polishing pad is less than about 1%, the amount of the cerium oxide particles adsorbed to the polishing pad may be insufficient, which can reduce the rate at which a patterned wafer can be polished. If the degree of adsorption of the cerium oxide particles to the polishing pad exceeds about 15%, filter clogging can occur due to the cerium oxide particles and can cause only the composition having the particles removed therefrom to pass through the filter, so that the CMP slurry composition causing the filter clogging cannot be supplied to the polishing equipment. Further, if the degree of adsorption exceeds about 15%, the adhesive force of the CMP slurry composition can become excessive, which can cause the slurry particles to be adsorbed not only to the polishing pad but also to the diamond disc conditioner and a surface of a pipe for delivering the CMP slurry composition. As a result, the abrasion rate of the diamond particles can increase and macro-particles can be formed in the CMP slurry composition through deposition of the slurry particles on the pipe surface, which can cause defects such as scratches on the surface of the semiconductor wafer.

The degree of adsorption may be calculated by the following equation.

Degree of adsorption (%)=(1−solid content after polishing/solid content before polishing)×100

The degree of adsorption may be calculated based on solid content in the CMP slurry composition before and after polishing as obtained by filtering the CMP slurry composition through a Depth-type filter made of polypropylene. Specifically, when a CMP slurry composition exhibiting strong adsorption characteristics is filtered through the depth type filter, particles in the composition are adsorbed to the surface of the filter and only a liquid fraction passes through the filter initially. Then, when the surface of the filter is saturated with particles, the slurry is allowed to pass therethrough. Calculation of the degree of adsorption is based on this principle. In one example, the filter used for calculation of the degree of adsorption was a Depth-type 1 μm pore filter (Profile®, Pall Co., Ltd.). In calculation of the degree of adsorption, 2 L of the CMP slurry composition was passed through the filter, followed by drying in an oven at 140° C. for 2 hours. The remaining solid content was then measured.

The CMP slurry composition may increase the polishing rate of the patterned oxide layer. In exemplary embodiments, the polishing rate of the patterned oxide layer may be increased such that the ratio (B/A) of a polishing rate B of the patterned oxide layer to a polishing rate A of the blanket oxide layer becomes about 0.1.5 or more. In one embodiment, the ratio (B/A) is about 0.15 to about 0.25.

Although the CMP slurry composition can be applied to any stage of the semiconductor polishing process, the slurry composition may be advantageously applied to an interlayer dielectric (ILD) process or shallow trench isolation (STI) process which is a process for polishing an oxide layer.

Polishing Method

Another aspect of the present invention provides a polishing method including polishing a semiconductor wafer using the CMP slurry composition according to the embodiment of the invention. In this case, since the CMP slurry composition can exhibit excellent polishing efficiency with respect to a patterned oxide layer, the semiconductor wafer to be polished advantageously includes a patterned oxide layer.

Hereinafter, the present invention will be described in more detail with reference to examples and test examples. Details apparent to those skilled in the art will be omitted herein for clarity.

Comparative Example 1

15.0 g of cerium oxide particles (obtained from Rhodia) having an average particle size of 100 nm are dispersed in 2979 g of deionized water and 0.6 g of poly(acrylic acid) (Mw=15,000 g/mol, solid content 50%, obtained from Aldrich) is added to the dispersion and stirred therewith for uniform blending. Then, the resultant slurry is adjusted to a pH of 4.0 using lactic acid (obtained from TCI), thereby preparing a CMP slurry composition.

Comparative Example 2

15.0 g of cerium oxide particles (obtained from Rhodia) having an average particle size of 100 nm are dispersed in 2979 g of deionized water. Then, the resultant slurry is adjusted to a pH of 4.0 using lactic acid, thereby preparing a CMP slurry composition.

Comparative Example 3

15.0 g of cerium oxide particles (obtained from Rhodia) having an average particle size of 100 nm are dispersed in 2979 g of deionized water and 0.6 g of 4-aminobenzoic acid is added to the dispersion and stirred therewith for uniform blending. Then, the resultant slurry is adjusted to a pH of 4.0 using lactic acid (obtained from TCI), thereby preparing a CMP slurry composition.

Example 1

The CMP slurry composition of Example 1 is prepared by the same method as in Comparative Example 3 except that 0.3 g of 3-hydroxy-1,2-dimethyl-4(1H)-pyridone (obtained from TCI) is added instead of the 4-aminobenzoic acid.

Example 2

The CMP slurry composition of Example 2 is prepared by the same method as in Comparative Example 3 except that 0.3 g of 5-quinolinol (obtained from TCI) is added instead of the 4-aminobenzoic acid.

Example 3

The CMP slurry composition of Example 3 is prepared by the same method as in Comparative Example 3 except that 0.3 g of 8-quinolinol (obtained from TCI) is added instead of the 4-aminobenzoic acid.

Example 4

The CMP slurry composition of Example 4 is prepared by the same method as in Comparative Example 3 except that 0.3 g of isonicotinic acid (obtained from TCI) is added instead of the 4-aminobenzoic acid.

Example 5

The CMP slurry composition of Example 5 is prepared by the same method as in Comparative Example 3 except that 0.3 g of nicotinic acid (obtained from TCI) is added instead of the 4-aminobenzoic acid.

Example 6

The CMP slurry composition of Example 6 is prepared by the same method as in Example 1 except that 3.0 g of polyethylene glycol (molecular weight: 200 g/mol) is added after pH adjustment.

Example 7

The CMP slurry composition of Example 7 is prepared by the same method as in Example 4 except that 3.0 g of polyethylene glycol (molecular weight: 200 g/mol) is was added after pH adjustment.

Example 8

The CMP slurry composition of Example 8 is prepared by the same method as in Example 5 except that 3.0 g of polyethylene glycol (molecular weight: 200 g/mol) is added after pH adjustment.

Tests: Measurement of Polishing Rate and Degree of Adsorption

1. Measurement of Polishing Rate Blanket Wafer

A PE-TESO wafer (8 inch, $SiO_2$-blanket wafer) is polished for 1 minute under the following conditions using each of the CMP slurry compositions prepared in Examples 1 to 8 and Comparative Examples 1 to 3. Polishing rate is calculated by measuring a reduction in the thickness of the wafer due to polishing. The polishing rate of the blanket wafer is measured using an atomic force microscope (AFM) in terms of a reduction in the thickness of the wafer before and after polishing. Results are shown in Table 1.

<Polishing Conditions of Blanket Wafer>
Polishing machine: AMAT Mirra (AMAT Co., Ltd.)
Polishing pad: IC1010 k-groove (Roddel Co., Ltd.)
Polishing time: 60 sec
Platen rpm: 103 rpm
Head rpm: 97 rpm
Flow rate: 200 ml/min.
Pressure: 3 psi 2. Measurement for Patterned Wafer A patterned HDP film wafer is polished using each of the CMP slurry compositions prepared in Examples 1 to 8 and Comparative Examples 1 to 3. As used here, the patterned wafer has protrusions, which are continuously formed thereon to occupy 50% of the total surface area of the wafer and each has a size of 5×5 um and a height of 3000 Å. The polishing conditions are the same as in polishing the blanket wafer except that the polishing pressure is 2 psi and the polishing time is 20 sec.

The polishing rate of the patterned wafer is measured using an atomic force microscope (AFM) in terms of a reduction in the thickness of the wafer before and after polishing. Results are shown in Table 1.

3. Measurement of Degree of Adsorption

After measuring the solid content in each of the CMP slurry compositions prepared in Examples 1 to 8 and Comparative Examples 1 to 3, 2 L of the CMP slurry compositions is passed through a Depth-type 1 μm pore filter (Profile®, Pall Co., Ltd.) made of polypropylene (PP). Upon completion of filtering, 4 g of CMP slurry composition is dried in an oven at a constant temperature of 140° C. for 2 hours, followed by measurement of the solid content remaining on the filter. Then, the degree of adsorption is obtained by applying the solid contents before and after filtering to the following Equation.

Results are shown in Table 1.

Degree of adsorption (%)=(1−solid content after filtering/solid content before filtering×100)

4. Measurement of Abrasion Rate of Diamond Particles of Diamond Disc Conditioner Polishing of an $SiO_2$ blanket wafer and pad conditioning are performed at the same time through the polishing machine (AMAT Mirra, AMAT Co., Ltd.) using the CMP slurry compositions prepared in Examples 1 to 8 and Comparative Examples 1 to 3 and a diamond disc conditioner. After each hour of polishing, the polishing and pad conditioning operation is stopped, the conditioner is detached from the polishing machine, and only pad conditioning is performed using pure water and a newly disposed polishing pad on the other polishing machine (the polishing equipment included two independently operable polishing machines, one of which is provided for polishing using the CMP slurry composition and the other of which is provided for polishing only with pure water (DI water)). In this case, the reduction in weight of the pad by conditioning is determined by measuring the weights of the newly disposed polishing pad before and after conditioning. As used herein, the concept of "pad cutting rate (PCR)" means a variation in weight of the newly disposed pad after each hour of conditioning while conditioning for 5 hours. Accordingly, variation in weight (PCR) determined in this manner is shown in Table 1.

TABLE 1

| | Adsorbent | Adsorption adjusting agent | pH | pH adjusting agent | A (Å/min) | B (Å/min) | B/A | D | PCR |
|---|---|---|---|---|---|---|---|---|---|
| Comparative Example 1 | Poly(acrylic acid) | — | 4.0 | lactic acid | 3520 | 214 | 0.06 | 0% | 45 |
| Comparative Example 2 | — | — | 4.0 | lactic acid | 2500 | 120 | 0.05 | 0% | 43 |
| Comparative Example 3 | 4-aminobenzoic acid | — | 4.0 | lactic acid | 3814 | 941 | 0.25 | 40% | 25 |
| Example 1 | 3-hydroxy-1,2-dimethyl-4(1H)-pyridone | — | 4.0 | lactic acid | 5429 | 1259 | 0.23 | 9% | 33 |
| Example 2 | 5-quinolinol | — | 4.0 | lactic acid | 2430 | 380 | 0.16 | 5% | 32 |
| Example 3 | 8-quinolinol | — | 4.0 | lactic acid | 2005 | 300 | 0.15 | 7% | 33 |
| Example 4 | isonicotinic acid | — | 4.0 | lactic acid | 6285 | 1058 | 0.17 | 8% | 33 |
| Example 5 | nicotinic acid | — | 4.0 | lactic acid | 6123 | 1053 | 0.17 | 7% | 32 |

TABLE 1-continued

|  | Adsorbent | Adsorption adjusting agent | pH | pH adjusting agent | A (Å/min) | B (Å/min) | B/A | D | PCR |
|---|---|---|---|---|---|---|---|---|---|
| Example 6 | 3-hydroxy-1,2-dimethyl-4(1H)-pyridone | PEG | 4.0 | lactic acid | 5350 | 1300 | 0.24 | 0% | 45 |
| Example 7 | isonicotinic acid | PEG | 4.0 | lactic acid | 6185 | 1004 | 0.16 | 0% | 44 |
| Example 8 | nicotinic acid | PEG | 4.0 | lactic acid | 6050 | 989 | 0.16 | 0% | 46 |

A: Blanket polishing rate
B: Pattern polishing rate
D: Degree of adsorption

In Table 1, it can be seen that Comparative Example 1 using poly(acrylic acid) in the preparation of the slurry composition exhibits poor polishing efficiency due to a much lower pattern polishing rate than Examples 1 to 8. This is attributed to the fact that the degree of adsorption of the cerium oxide particles to the polishing pad is very low.

For the slurry composition of Comparative Example 2 that does not include the adsorbent, the pattern polishing rate is comparatively very low, thereby increasing polishing time when polishing a wafer including a patterned oxide layer, which indicates poor polishing efficiency.

For the slurry composition of Comparative Example 3, the pattern polishing rate is similar to those of Examples 1 to 8, but the degree of adsorption (approaching 40%) is very high. This high degree of adsorption resulted in contamination not only of the polishing pad, but also of the surface of the diamond disc and the pipe due to adsorption of the cerium oxide particles thereto, thereby causing scratches on the wafer. This phenomenon can be confirmed from the PCR of Comparative Example 3.

For the slurry compositions of Examples 6 to 8 including the adsorption adjusting agent as described above, it is confirmed that the degree of adsorption of the cerium oxide particles to the polishing pad is adjusted (that is, superior degrees of adsorption is obtained to as compared to Examples 1 to 5). It is also confirmed that the adsorption adjusting agent contained in the slurry compositions of Examples 6 to 8 improved the PCR obtained by measuring the abrasion rate of the diamond particles, thereby improving the abrasion of the diamond disc conditioner.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A CMP slurry composition comprising:
cerium oxide particles;
an adsorbent for adsorbing the cerium oxide particles to a polishing pad, wherein the adsorbent comprises 3-hydroxy-1,2-dimethyl-4(1H)-pyridone, 2-hydroxy-3,5-dinitropyridine, 3 or a combination thereof;
an adsorption adjusting agent for adjusting adsorption performance of the adsorbent; and
a pH adjusting agent.

2. The CMP slurry composition of claim 1, wherein the adsorption adjusting agent is a non-ionic surfactant represented by the following Formula 1, Formula 2, or a combination thereof:

$$RO(CH_2CH_2O)n\text{-}R' \quad \text{Formula 1}$$

$$RO(CH_2CHCH_3O)n\text{-}R' \quad \text{Formula 2}$$

wherein in Formulas 1 and 2, R and R' are the same or different and are each independently hydrogen or C1-C18 alkyl, and n is an integer from 3 to 10.

3. The CMP slurry composition of claim 1, wherein the adsorption adjusting agent is polyethylene glycol or polypropylene glycol having a weight average molecular weight of about 200 to about 3500 g/mol.

4. The CMP slurry composition of claim 1, wherein, when filtered through a Depth-type 1 μm pore filter made of polypropylene (PP), the CMP slurry composition has a degree of adsorption of about 15% or less, as defined by the following Equation:

Degree of adsorption (%)=(1−solid content after polishing/solid content before polishing)×100.

5. The CMP slurry composition of claim 1, wherein a ratio (B/A) of a polishing rate (B) of a patterned oxide layer to a polishing rate (A) of a blanket oxide layer is about 0.15 or more.

6. The CMP slurry composition of claim 1, wherein the pH adjusting agent comprises formic acid, acetic acid, lactic acid, propionic acid, pentanoic acid, hexanoic acid, heptanoic acid, octanoic acid, oxalic acid, maleic acid, glutamic acid, tartaric acid, malonic acid, fumaric acid, citric acid, glycolic acid, succinic acid, butyric acid, trimethanolamine, triethanolamine, trimethylammonium hydroxide, triethylammonium hydroxide, dimethylbenzylamine, ethoxybenzyl amine, potassium hydroxide, or a combination thereof.

7. The CMP slurry composition of claim 1, wherein the adsorbent further comprises 3-quinoline carboxylic acid, 4-quinoline carboxylic acid, 2,4-quinolinediol, 2,6-quinolinediol, 2,8-quinolinediol, 4-quinolinol, 5-quinolinol, 8-quinolinol, 4-pyridoxic acid, or a combination thereof.

8. A polishing method comprising polishing a semiconductor wafer using the CMP slurry composition according to claim 1 during an interlayer dielectric process or a shallow trench isolation process.

* * * * *

UNITED STATES PATENT AND TRADEMARK OFFICE
CERTIFICATE OF CORRECTION

| | |
|---|---|
| PATENT NO. | : 9,123,660 B2 |
| APPLICATION NO. | : 13/534647 |
| DATED | : September 1, 2015 |
| INVENTOR(S) | : Tai Young Kim et al. |

Page 1 of 1

It is certified that error appears in the above-identified patent and that said Letters Patent is hereby corrected as shown below:

In the Specification

Column 2, Line 52 reads: "the cerium oxide particles are finely adhered;"
and should read: "the cerium oxide particles are firmly adhered;"

Signed and Sealed this
Tenth Day of May, 2016

Michelle K. Lee
*Director of the United States Patent and Trademark Office*